United States Patent
Chang

(10) Patent No.: US 8,648,457 B2
(45) Date of Patent: Feb. 11, 2014

(54) WIRING PATTERN FOR TOUCH INTEGRATED CIRCUIT

(71) Applicant: Egalax_Empia Technology Inc., Taipei (TW)

(72) Inventor: Chin-Fu Chang, Taipei (TW)

(73) Assignee: Egalax_Empia Technology Inc., Taipei (TW)

( * ) Notice: Subject to any disclaimer, the term of this patent is extended or adjusted under 35 U.S.C. 154(b) by 0 days.

(21) Appl. No.: 13/851,254

(22) Filed: Mar. 27, 2013

(65) Prior Publication Data

US 2013/0256111 A1    Oct. 3, 2013

Related U.S. Application Data

(60) Provisional application No. 61/616,506, filed on Mar. 28, 2012.

(30) Foreign Application Priority Data

Dec. 28, 2012 (TW) .............................. 101150796 A

(51) Int. Cl.
*G06F 3/044*     (2006.01)
*H01L 23/482*    (2006.01)
*H03K 17/96*     (2006.01)

(52) U.S. Cl.
CPC .................................. *H01L 23/482* (2013.01)
USPC ......................................................... 257/693

(58) Field of Classification Search
CPC ... H01L 29/417; H01L 23/50; H01L 23/4822; H01L 23/482; H01L 23/48
USPC ............................ 257/692, 693; 345/173, 174
See application file for complete search history.

(56) References Cited

U.S. PATENT DOCUMENTS

| | | | | |
|---|---|---|---|---|
| 7,312,732 B2 * | 12/2007 | Engl | | 341/118 |
| 8,106,668 B2 * | 1/2012 | Matsushima | | 324/686 |
| 8,390,582 B2 * | 3/2013 | Hotelling et al. | | 345/173 |
| 8,547,115 B2 * | 10/2013 | Lin et al. | | 324/679 |
| 2013/0176281 A1 * | 7/2013 | Hotelling et al. | | 345/174 |

* cited by examiner

*Primary Examiner* — Evan Pert
(74) *Attorney, Agent, or Firm* — WPAT, PC; Justin King

(57) ABSTRACT

Electrodes on a touch sensor are connected with pins of an integrated circuit by wires. The wires connecting a first side of the integrated circuit go under the integrated circuit to the electrodes, and wires connecting a second side of the integrated circuit have segments extending away from the touch sensor under the integrated circuit.

8 Claims, 3 Drawing Sheets

US 8,648,457 B2

WIRING PATTERN FOR TOUCH INTEGRATED CIRCUIT

CROSS REFERENCE TO RELATED PATENT APPLICATION

This patent application claims the domestic priority of the U.S. provisional application 61/616,506 filed on Mar. 28, 2012, and hereby incorporated by reference. This patent application claims the benefit of Taiwan Application Serial No. 101150796, filed on Dec. 28, 2012, which is herein incorporated by reference for all intents and purposes.

BACKGROUND OF THE INVENTION

1. Field of the Invention

The present invention relates to wiring patterns, and more particularly, to a wiring pattern for a touch integrated circuit.

2. Description of the Prior Art

In a projective capacitive touch sensor, sensing electrodes provide capacitive coupling signals. The capacitive coupling signals are passed from the touch sensor to pins of a touch integrated circuit via wires of a circuit board (or flexible printed circuit). If there are overlaps between the wires, additional capacitive coupling will occur between the wires, which may affect the accuracy of the capacitive coupling signals. Thus, the wires have to be arranged in parallel with no crossing.

In the prior art, wires are connected to sequentially arranged pins on either side of the touch integrated circuit. Adjacent pins on the same side of the touch integrated circuit are coupled to adjacent electrodes. As shown in FIG. 1, it can be seen that one of the two sides of the touch integrated circuit 20 requires longer wires 30 which bypass the touch integrated circuit 20 in order to be connected to a touch sensor 10. By doing so, a consider amount of space will be occupied and unnecessarily waste. Moreover, if adjacent electrodes are connected to pins on different sides, such as those shown by the N/2$^{th}$ wire 30 and the 1+N/2$^{th}$ wire 30, capacitive coupling signals may be affected due to a difference in the background interference.

From the above it is clear that prior art still has shortcomings. In order to solve these problems, efforts have long been made in vain, while ordinary products and methods offering no appropriate structures and methods. Thus, there is a need in the industry for a novel technique that solves these problems.

SUMMARY OF THE INVENTION

In the prior art, the wires connecting the touch sensor to the touch integrated circuit are arranged in such a way that bypass the touch integrated circuit, which occupies a large amount of space. Also, when adjacent electrodes are coupled to pins on different sides of the touch integrated circuit, the capacitive coupling may be influenced due to different background interferences experienced. A wiring pattern for a touch integrated circuit is provided by the present invention, in which wires connecting a first side of the integrated circuit go under the integrated circuit to the electrodes, and wires connecting a second side of the integrated circuit have segments extending away from the touch sensor under the integrated circuit. As such, adjacent wires will all pass underneath the touch integrated circuit, and will experience similar interferences under the touch integrated circuit. This also saves a consider amount of layout space.

The above and other objectives of the present invention can be achieved by the following technical scheme. A wiring pattern for a touch integrated circuit provided by the present invention may include: a plurality of first wire segments arranged in parallel and distributed underneath the touch integrated circuit, each of the first wire segments having a first end in proximity to a first side of the touch integrated circuit and a second end in proximity to a second end of the touch integrated circuit, wherein the first and second sides are opposite to each other; a plurality of second wire segments arranged in parallel, each of the second wire segments connecting with one of the first wire segments at odd locations of a sequential order and one of pins on the first side of the touch integrated circuit; a plurality of third wire segments arranged in parallel, each of the third wire segments connecting with one of the first wire segments at even locations of the sequential order and one of pins on the second side of the touch integrated circuit; and a plurality of fourth wire segments arranged in parallel, each of the fourth wire segments extending from one of the first wire segments to a touch sensor.

With the above technical scheme, the present invention includes at least the following advantage and beneficial effect: adjacent wires may experience similar interferences, and a considerable amount of layout space can be saved.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
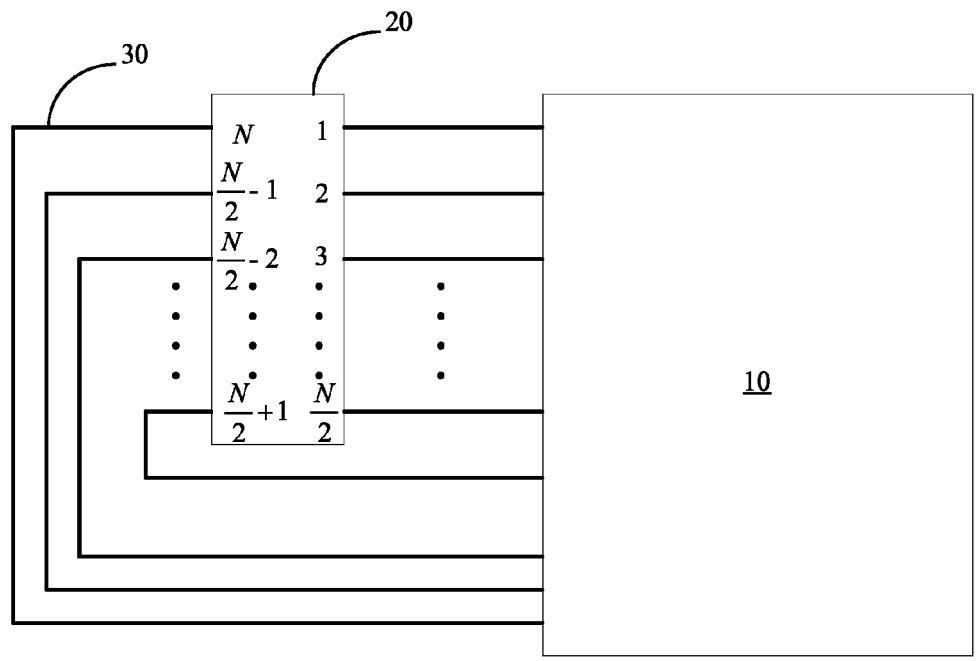
FIG. 1 is a schematic diagram depicting conventional wires connecting a touch integrated circuit and a touch sensor in the prior art.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Figure 2:
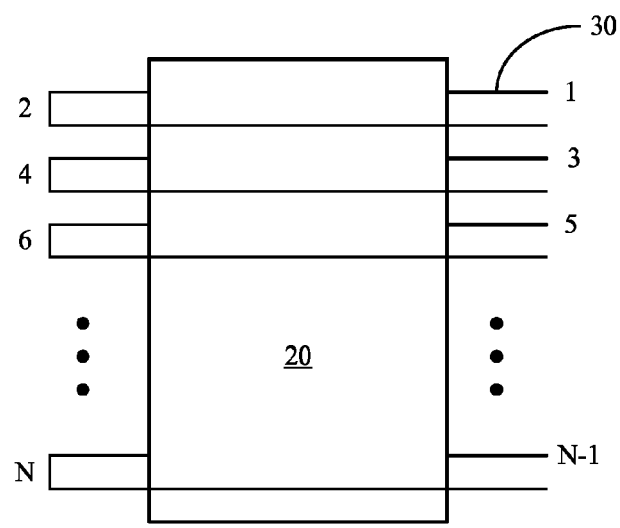
FIGS. 2 and 3 are schematic diagrams illustrating wires connecting to one side of a touch integrated circuit going underneath the touch integrated circuit.

A wiring pattern for a touch integrated circuit is provided by the present invention, in which wires arranged in parallel are connected with a touch sensor and pins of a touch integrated circuit 20 in such a way that all the wires coupled to a first side of the touch integrated circuit pass underneath the touch integrated circuit, and are staggered with wires coupled to a second side of the touch integrated circuit, as shown in FIG. 2, which is a schematic diagram depicting a bottom view of a touch integrated circuit.

Figure 3:
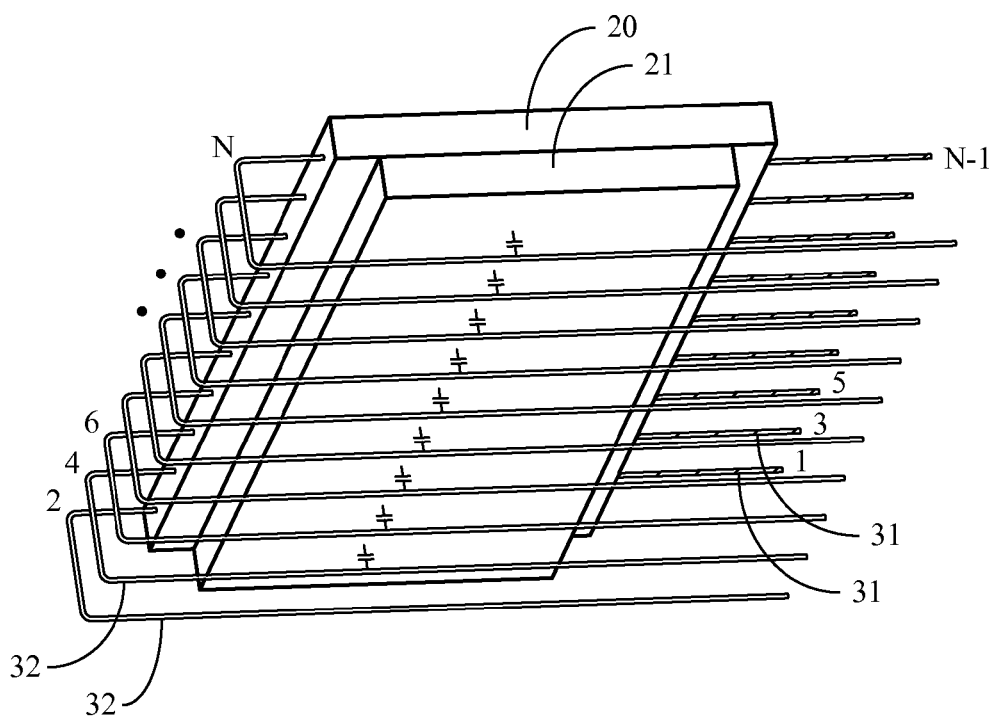

However, capacitive effects (capacitive coupling) will occur between wires 32 at locations designated with even numbers (2, 4, 6 . . . ) in FIG. 2 and the metal material 21 of a heat sink disposed underneath the integrated circuit 20, as shown in FIG. 3, so signals transmitted by the wires will be affected. Compared with the wires that do not pass underneath the touch integrated circuit (wires 31 at locations designated with odd numbers (1, 3, 5 . . . )), the wires at locations designated with even numbers will have more interference due to the capacitive effects just mentioned.

Figure 4:
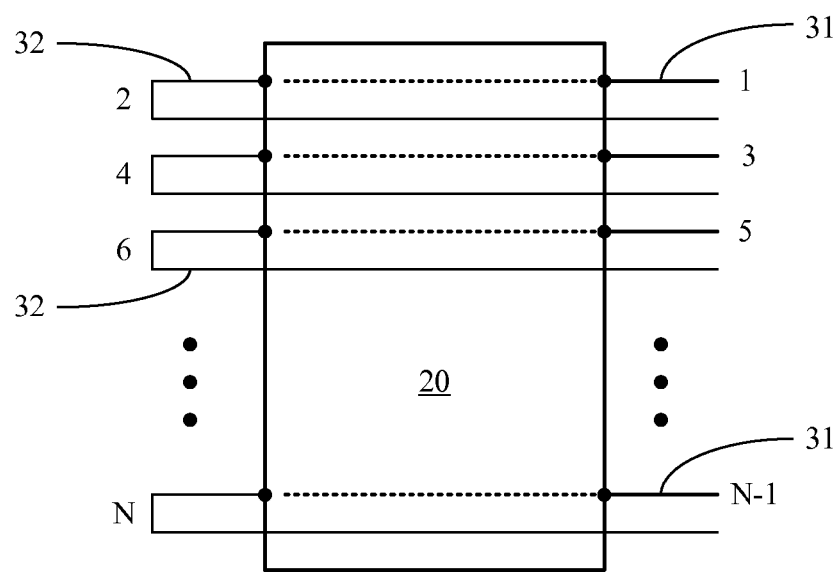
FIGS. 4 and 5 are schematic diagrams illustrating a wiring pattern for a touch integrated circuit in accordance with a best mode of the present invention.

In order for the influences on the wires on both sides of the touch integrated circuit coupled to electrodes to be as close as possible to each other, the wires that originally do not go underneath the touch integrated circuit are extended and arranged to pass underneath the touch integrated circuit, as shown by dotted lines in FIG. 4, so that a portion of every wire of the touch integrated circuit 20 coupled to the electrodes passes underneath the touch integrated circuit.

In other words, in order to solve the abovementioned capacitive effects, the wires 31 at the locations designated with odd numbers (1, 3, 5 . . . ) are extended to below the touch integrated circuit. The extended length are the same or almost the same length as the portions of the wires 33 at the locations designated with even numbers (2, 4, 6 . . . ) that are underneath the touch integrated circuit, as indicated by the dotted lines in FIG. 4, which is a schematic diagram depicting a bottom view of a touch integrated circuit. As a result, capacitive effects will also occur between the wires 31 at the locations designated with odd numbers (1, 3, 5 . . . ) and the metal material 21 of the touch integrated circuit 20.

Such a design is particularly useful for calculating signal differences between each pair of adjacent electrodes, as the capacitive effects can be canceled out. Each wire is similar in length with an adjacent wire, so any common mode noise experienced, including but not limited to the capacitive effects, may also be similar. Moreover, signals detected by pins designed with adjacent numbers can be subtracted from each other, so as to generate a difference in the signals detected by the pins designed with adjacent numbers in a digital or an analog manner, thereby effectively eliminating common mode noise.

Figure 5:
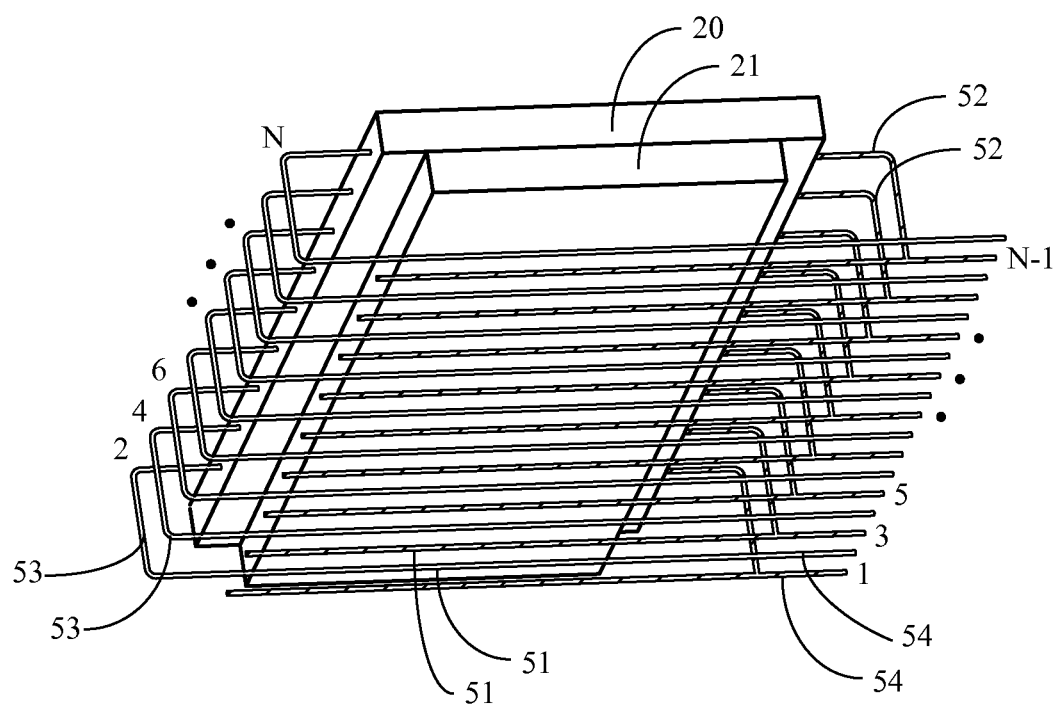

Accordingly, referring to FIG. 5, in a best mode of the present invention, a wiring pattern for a touch integrated circuit 20 includes a plurality of first wire segments 51 arranged in parallel, a plurality of second wire segments 52 arranged in parallel, a plurality of third wire segments 53 arranged in parallel, and a plurality of fourth wire segments 54 arranged in parallel. The plurality of first wire segments 51 arranged in parallel are distributed underneath a touch integrated circuit 20, each of the first wire segments 51 have a first end in proximity to a first side of the touch integrated circuit 20 and a second end in proximity to a second end of the touch integrated circuit 20, wherein the first and second sides are opposite to each other. In addition, each of the second wire segments 52 connects with one of the first wire segments 51 at odd locations of a sequential order and one of pins on the first side of the touch integrated circuit 20, and each of the third wire segments 53 connects with one of the first wire segments 51 at even locations of the sequential order and one of pins on the second side of the touch integrated circuit 20. Each of the fourth wire segments 54 extends from one of the first wire segments 51 to one of a plurality of electrodes of a touch sensor.

Each of the first wire segments 51 are capacitive coupled with a metal material 21 underneath the touch integrated circuit 20, and adjacent first wire segments 51 have similar capacitive coupling with the metal material 21. Furthermore, all of the fourth wire segments 54 can extend from the first ends of the first wire segments 51 to the touch sensor. Alternatively, all of the fourth wire segments 54 can extend from the second ends of the first wire segments 51 to the touch sensor. In an example of the present invention, each of the fourth wire segments 54 is coupled to one of a plurality of electrodes arranged vertically and in parallel with each other in the touch sensor. Alternatively, each of the fourth wire segments 54 is coupled to one of a plurality of electrodes arranged horizontal and in parallel with each other in the touch sensor. In another example of the present invention, a portion of the fourth wire segments 54 are coupled to a plurality of electrodes arranged vertically and in parallel with each other in the touch sensor, while the other portion of the fourth wire segments 54 are coupled to a plurality of electrodes arranged horizontal and in parallel with each other in the touch sensor.

In other words, two first wire segments 51 adjacent in the arranged order are coupled to one of the pins on the first side and one of the pins on the second side of the touch integrated circuit, respectively.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A wiring pattern for a touch integrated circuit comprising:
   a plurality of first wire segments arranged in parallel and distributed underneath the touch integrated circuit, each of the first wire segments having a first end in proximity to a first side of the touch integrated circuit and a second end in proximity to a second side of the touch integrated circuit, wherein the first and second sides are opposite to each other;
   a plurality of second wire segments arranged in parallel, each of the second wire segments connecting with one of the first wire segments at odd locations of a sequential order and one of a plurality of pins on the first side of the touch integrated circuit;
   a plurality of third wire segments arranged in parallel, each of the third wire segments connecting with one of the first wire segments at even locations of the sequential order and one a plurality of pins on the second side of the touch integrated circuit; and
   a plurality of fourth wire segments arranged in parallel, each of the fourth wire segments extending from one of the first wire segments to a touch sensor.

2. The wiring pattern of claim 1, wherein each of the first wire segments is capacitively coupled with a metal material underneath the touch integrated circuit.

3. The wiring pattern of claim 1, wherein the fourth wire segments extend from the first end of the first wire segments to the touch sensor.

4. The wiring pattern of claim 1, wherein the fourth wire segments extend from the second end of the first wire segments to the touch sensor.

5. The wiring pattern of claim 1, wherein two first wire segments adjacent in the sequential order are coupled to one of the plurality of pins on the first side and one of the plurality of pins on the second side of the touch integrated circuit, respectively.

6. The wiring pattern of claim 1, wherein each of the fourth wire segments are coupled to one of a plurality of electrodes arranged vertically and in parallel with each other in the touch sensor.

7. The wiring pattern of claim 1, wherein each of the fourth wire segments are coupled to one of a plurality of electrodes arranged horizontally and in parallel with each other in the touch sensor.

8. The wiring pattern of claim 1, wherein two adjacent fourth wire segments are coupled to two adjacent electrodes of a plurality of electrodes arranged in parallel to each other in the touch sensor.

* * * * *